United States Patent
Tomi-Tricot et al.

(10) Patent No.: US 12,111,374 B2
(45) Date of Patent: Oct. 8, 2024

(54) COMPUTER-IMPLEMENTED MAGNETIC RESONANCE IMAGE OPTIMISATION METHOD

(71) Applicant: Siemens Healthineers AG, Forchheim (DE)

(72) Inventors: Raphael Tomi-Tricot, London (GB); Radhouene Neji, London (GB)

(73) Assignee: SIEMENS HEALTHINEERS AG, Forchheim (DE)

( * ) Notice: Subject to any disclaimer, the term of this patent is extended or adjusted under 35 U.S.C. 154(b) by 145 days.

(21) Appl. No.: 17/729,482

(22) Filed: Apr. 26, 2022

(65) Prior Publication Data
US 2022/0349973 A1    Nov. 3, 2022

(30) Foreign Application Priority Data
Apr. 29, 2021    (GB) ...................... 2106157

(51) Int. Cl.
*G01R 33/56*    (2006.01)
*G01R 33/44*    (2006.01)

(52) U.S. Cl.
CPC ....... *G01R 33/5608* (2013.01); *G01R 33/445* (2013.01)

(58) Field of Classification Search
CPC ..................... G01R 33/445; G01R 33/5608
See application file for complete search history.

(56) References Cited

U.S. PATENT DOCUMENTS

| | | | |
|---|---|---|---|
| 8,472,689 B2* | 6/2013 | Souza | G06T 5/77 382/131 |
| 2005/0078882 A1* | 4/2005 | Ho | G06T 5/73 382/254 |
| 2020/0011953 A1 | 1/2020 | Tomi-Tricot et al. | |
| 2021/0192689 A1* | 6/2021 | Bosse | G06F 18/2135 |

FOREIGN PATENT DOCUMENTS

EP    3594710 A1    1/2020

OTHER PUBLICATIONS

Cloos, M. A. et al. "kT-Points: Short Three-Dimensional Tailored RF Pulses for Flip-Angle Homogenization Over an Extended Volume" Magnetic Resonance in Medicine, vol. 67, pp. 72-80, 2012 // DOI: 10.1002/mrm.22978.

(Continued)

*Primary Examiner* — Gregory H Curran
(74) *Attorney, Agent, or Firm* — Harness, Dickey & Pierce, P.L.C.

(57) ABSTRACT

A computer-implemented magnetic resonance image optimisation method is disclosed. An image of an object is mapped using a static magnetic field and divided into a plurality of voxels. Each voxel is represented in a Euclidean n-dimensional space, where n≥3, and clustered by grouping together voxels having similar characteristics to create homogenous clusters. The centre or centroid of each cluster is determined, and used, or the voxel closest to either the centre or the centroid is used, as a super-voxel in an optimisation procedure. An optimised diagnostic image of the object is then generated.

11 Claims, 4 Drawing Sheets

(56) References Cited

OTHER PUBLICATIONS

Tricot-Tomi, Raphael et al: "Fully Integrated Scanner Implementation of Direct Signal Control for 2D T2-Weighted TSE at Ultra-High Field"; Proceedings of The 2021 ISMRM & SMRT Annual Meeting & Exhibition, May 15-20, 2021, ISMRM, 2030 Addison Street, 7th Froor, Berkeley, CA 94704 USA; No. 621, Apr. 30, 2021 (Apr. 30, 2021), XP040722641.
Malik S., et.al.: "Tailored Excitation in 3D with Spiral Nonselective (SPINS) RF pulses", in: Magnetic Resonance in Medicine, vol. 67, pp. 1303-1315; 2012.
Eggenschwiler, F,; O'Brien, K.R. et al.: "3D T 2-weighted imaging at 7T using dynamic kT-points on single-transmit MRI systems", in: Magnetic Resonance Materials in Physics, Biology and Medicine. Jun. 2016;29(3):347-358.
Zexuan, Ji et al: A fuzzy clustering algorithm with robust spatially constraint for brain MR image segmenataion2; IEEE International Conference of Fuzzy Systems (FUZZ-IEEE); Year: 2014, pp. 202-209, XP032637135.
Gras, V.; Mauconduit, F. et al. "Design of universal parallel-transmit refocusing kT-point pulses and application to 3D T2-weighted imaging at 7T", in: Magn Reson Med. Jul. 2018;80(1):53-65.
Xianglun, Mao et al: "Global and peak local specific absorption rate control on parallel transmit systems using k -means SAR compressiom model"; Magnetic Resonance in Medicine; vol. 85, Year: 2020, pp. 1093-1103, XP055874540.
Malik, S.J.; Beqiri, A et al.: "Direct signal control of the steady-state response of 3D-FSE sequences", in: Magn Reson Med. Mar. 1, 2015;73(3):951-63.
Padormo, Francesco, et al. "Parallel transmission for ultrahigh-field imaging." NMR in Biomedicine 29.9 (2016):1145-1161.

\* cited by examiner

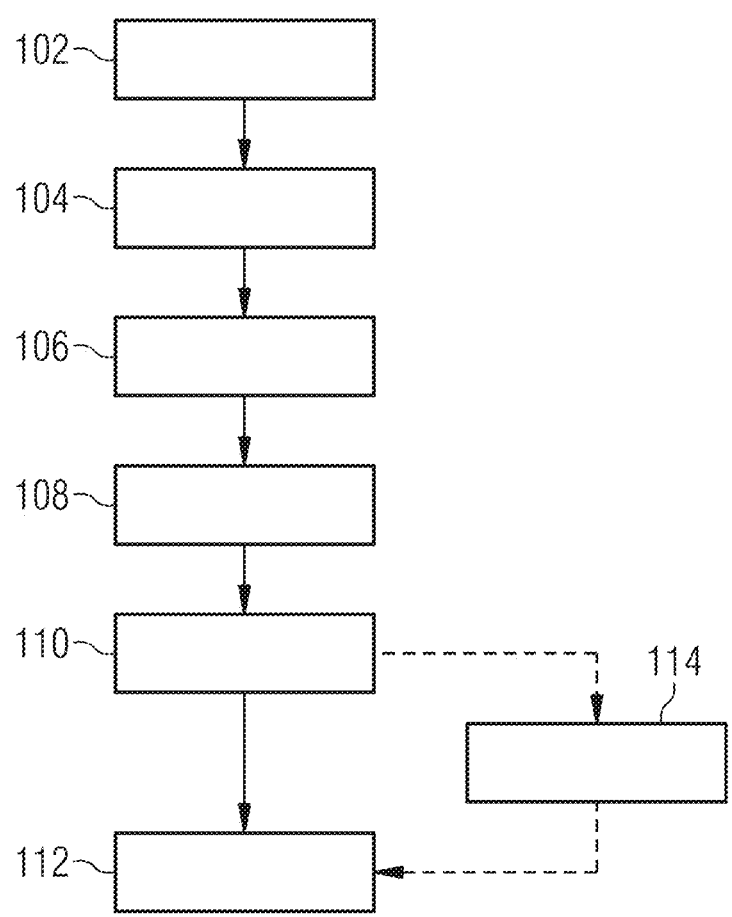

COMPUTER-IMPLEMENTED MAGNETIC RESONANCE IMAGE OPTIMISATION METHOD

CROSS-REFERENCE TO RELATED APPLICATION(S)

The present application hereby claims priority under 35 U.S.C. § 119 to Great Britain patent application number GB 2106157.7 filed Apr. 29, 2021, the entire contents of which are hereby incorporated herein by reference.

FIELD

At least some example embodiments relate to computer-implemented magnetic resonance image optimisation methods in particular the generation of an optimised diagnostic image of an object.

BACKGROUND

Magnetic resonance imaging (MRI) is used frequently in medical applications as a diagnostic and staging tool. A patient is exposed to a static magnetic field B0 and an incident pulsed RF (radio-frequency) signal, which excite the nuclear spin energy transition in hydrogen atoms present in water and fat in the body. Magnetic field gradients are used to localise the resulting magnetisation in space, leading to the generation of an image. Varying the parameters of the pulse sequence used to excite the nuclear spin energy transition creates different contrasts between tissues due to the relaxation properties of the hydrogen atoms. Such imaging techniques are used in neurological, cardiovascular, musculoskeletal and gastrointestinal investigations, as well as angiography. Images may or may not be obtained with the use of contrast agents, such as gadolinium, to highlight features of interest.

Most medical MRI imaging employs a toroidal coil element arrangement capable of generating a static magnetic field B0 of 1.5T, which results in a frequency of the incident RF signal of f0 of 64 Mhz, where f0=γHB0, γH being the gyromagnetic ratio. The wavelength λ0 of the magnetic field within the human body is therefore approximately 60 cm, which largely exceeds the typical dimension of the largest organs and body sections. Standard scanners also adopt circular polarisation where two sets of transmit coils have equal RF signal amplitude and 90 degree phase shift, resulting therefore in a single circularly polarized RF transmit channel. The amplitude of the RF signal can be adjusted to calibrate transmit power Higher magnetic field strength, such as 3.0T scanners, brings benefits such as increased spatial resolution and signal-to-noise ratio, faster examination times, improved fat/water separation and increased T1 signal, resulting in lower gadolinium doses for patients. However, with this comes a patient exposure to increased energy and pronounced RF signal or B1+ transmit field inhomogeneities. Taking a static magnetic field strength B0 of 3.0T gives an incident RF signal frequency f0 of 128 MHz, and therefore a wavelength λ0 of approximately 30 cm, which is of the order of or smaller than the dimension of the largest organs and body sections, such as the abdomen, the thighs or the spine . When considering a 7.0T scanner, of interest due to the enhanced spatial resolution and SNR for brain scans, the incident RF signal wavelength λ0 is approximately 13 cm, or roughly the cross-section of the human skull. B1+ inhomogeneities from the incident RF signal lead to areas of increased shading and non-uniformity effects within the resulting images, leading to signal loss and increased imaging brightening in T2-weighted images, for example, at increasing B0.

One method of dealing with such B1+ magnetic field inhomogeneities is to use an RF shimming approach. This is where rather than a single transmit channel Ch for all of the coil elements, at least two (NCh≥2) are provided. This allows the same waveform p(t) to be transmitted on each channel:

$$B_1^+(r,\ t) = p(t) \sum_{c=1}^{N_{Ch}} \omega_c S_c^+(r)$$

But enables the channels to be transmitting signals having amplitudes or phases ωc, as well as to make use of sensitivity profiling for each channel Sc+(r). By utilising various phases and waveforms constructive interference can be generated resulting in a B1+ field with a greater homogeneity, and an image with improved homogeneity and reduced shading. Over a number of parallel transmit channels it may also be desirable to control the RF signal from pulse to pulse dynamically, in order to improve image quality still further. This is known as Dynamic Signal Control, or DSC.

Both RF shimming and DSC require knowledge of the propagation of the RF signal transmitted by each transmit channel. Furthermore, channel transmit behaviour may also be required for on-the-fly computation or computation over a database of maps In other words, channel-wise B1+ maps are a necessity. Once these channel-wise B1+ maps are created an algorithm is run to minimise over the whole image both the deviation of the B1+ field from a target (RF shimming) and the RF signal deviation from a target (DSC). The quality of the B1+ maps, expressed both in fidelity and spatial resolution, is essential to a successful RF pulse design. The minimal required resolution depends on the wavelength of the RF field in the volume of interest, which in turns is influenced by the frequency used (and thus the main static field strength B0), and the electromagnetic properties of the tissue being imaged (mainly its permittivity for human tissues). For instance, for human tissue imaging at 7T, a B1+ mapping resolution of 5 mm, sometimes finer, is often used, leading to 10,000 voxels for an image of an adult human brain.

For some applications working with such a large number of voxels is acceptable, as the computational time required for processing is not an issue (whilst the calculations required for RF shimming may take seconds, those required for DSC may take many hours).

SUMMARY

In clinical applications, where time is limited image optimisation is achieved in less than one minute. Consequently, it is useful to be able to select a meaningful sample of voxels quickly, and to be able to process these voxels within a short time period in order to optimise a clinical image. This may mean reducing the overall number of voxels from 10,000 to 50 or 100. Different approaches to such sub-sampling may be used with varying degrees of success. For example, grid decimation retains one voxel in every n voxels in each direction, but may lead to a coarse grid where peaks and troughs in the B1+ field are missed, or outliers that are not part of the image of interest are picked. Alternatively, voxel aggregation may be used, where groups of voxels are merged together, for example 5×5×5 voxels in each direction merged to form one super-voxel. However, this will average out the B1+ field intensities, as the relative difference between peaks and troughs are less intense. To avoid these issues randomisation may be used, where random voxels are selected, but again this may lead to selecting outliers or overlooking features of interest. Different randomisations may yield different results from the same image and may not be reproducible. It is helpful therefore to be able to find a method to optimise magnetic resonance images in a clinical (or other time-bound) situation with minimal effect on the quality of information contained in the original image.

At least some example embodiments address these issues by providing, in a computer-implemented magnetic resonance image optimisation method, comprising: a) mapping an image of an object obtained using a static magnetic field B0 and an incident radio frequency (RF) signal by dividing the image into m identically sized three-dimensional voxels, the dimensions of the voxels being determined by a desired mapping resolution; b) representing each voxel in a Euclidean n-dimensional space, where n≥3, each voxel having a voxel location represented by at least a two-dimensional position and at least one voxel characteristic represented by at least one further dimension; c) clustering the voxel space by grouping together voxels having similar characteristics to create homogenous clusters; d) determining the centre or centroid of each cluster; e) using either the determined centre or centroid of each cluster, or the voxel closest to the determined centre or centroid, as a super-voxel in an optimisation procedure; and f) generating an optimised diagnostic image of the object.

The clustering approach of at least some example embodiments is data-driven and based directly on features of interest for the optimisation process. The advantage of this approach is that an effective voxel size can be adapted to suit the regions of a volume of interest, either coarser or finer, depending on the underlying magnetic field distribution.

Each voxel location may be represented by a two-dimensional position having x and y co-ordinates. Alternatively, each voxel location may be represented by a three-dimensional position having x, y and z co-ordinates.

Preferably, each characteristic comprises a local B1+ transmit magnetic field amplitude induced by the incident RF signal at the voxel location. In this case, the step of clustering comprises partitioning the m voxels into j super voxels based on the nearest mean B1+ transmit magnetic field amplitude of a super voxel.

Alternatively, each characteristic may comprise a local B0 static magnetic field amplitude at the voxel location. In this case, the step of clustering may comprise partitioning the m voxels into j super voxels based on the nearest B0 magnetic field amplitude of a super voxel.

Preferably, the clustering is performed using a k-means algorithm.

Preferably, the step of mapping comprises obtaining the image using one of: a circularly polarised B1+ field; an RF shimming technique; a homogenisation technique or a Direct Signal Control technique.

The optimisation procedure may further comprise using one or several weighting parameters derived from tracking the cardinality of the clusters. Preferably, the weighting parameters comprise the size of the cluster the super-voxel is derived from.

At least one example embodiment provides a data processing system adapted to optimise a magnetic resonance image, comprising: a processor adapted to map an image of an object obtained using a static magnetic field B0 and an incident radio frequency (RF) signal by dividing the image into m identically sized three-dimensional voxels, the dimensions of the voxels being determined by a desired mapping resolution; represent each voxel in a Euclidean n-dimensional space, where n≥3, each voxel having a voxel location represented by at least a two-dimensional position and at least one voxel characteristic represented by at least one further dimension; cluster the voxel space by grouping together voxels having similar characteristics to create homogenous clusters; determine the centre or centroid of each cluster; use either the determined centre or centroid of each cluster, or the voxel closest to the determined centre or centroid as a super-voxel in an optimisation procedure and generate an optimised diagnostic image of the object.

Example embodiments comprise a computer program comprising instructions, which when the program is executed by a computer, cause the computer to carry out the steps of the method outlined above.

BRIEF DESCRIPTION OF THE DRAWINGS

Example embodiments will now be described by way of example only, and with reference to the accompanying drawings, in which:

FIG. 1 is a flow chart of the steps in a computer-implemented method according to at least one example embodiment;

DETAILED DESCRIPTION

Figure 2A:
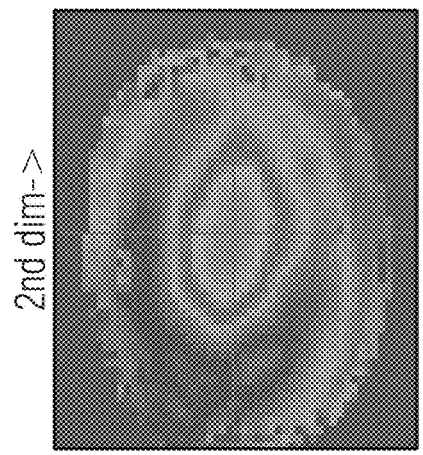
FIGS. 2A, 2B and 2C are a combined B1+ map used as a starting point for the DSC algorithm.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. At least one example embodiment, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments. Example embodiments may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one example embodiment relates to the non-transitory computer-readable storage medium including electronically readable control information (processor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Example embodiments take a different approach to forming the super-voxels used in a computer-implemented magnetic resonance image optimisation method to that done previously. Initially, an image of an object obtained using a static magnetic field B0 and an incident radio frequency (RF) signal is mapped by dividing the image into m identically sized three-dimensional voxels, the dimensions of the voxels being determined by a desired mapping resolution. Ideally such mapping results in isometric voxels, of equal length in orthogonal directions. Next, each voxel is represented in a Euclidean n-dimensional space, where n≥3. Each voxel has a voxel location represented by at least a two-dimensional position and at least one voxel characteristic represented by at least one further dimension. For a two-dimensional voxel therefore, the third dimension represents a characteristic. Clustering the voxel space takes place by grouping together voxels having similar n-dimensional representations according to a chosen metric to create homogenous clusters. At this point the centre or centroid of each cluster is determined. This decision may be taken by a user or may be pre-selected depending on the type of image analysis that will take place once the image optimisation method is complete. Either the determined centre or centroid of each cluster, or the voxel closest to the determined centre or centroid, is used as a super-voxel in an optimisation procedure, which is then followed by generating an optimised diagnostic image of the object. Voxel clustering, therefore, represents an approach to generating super-voxels that does not suffer from the issues of the grid decimation, aggregation and randomisation methodologies used previously.

Example embodiments are suitable for use with any two-or three-dimensional magnetic resonance image.

In the examples described below, images were obtained using the scanner and apparatus shown in FIG. 5, which may be a MAGNETOM Terra 7T MRI scanner, manufactured by Siemens Healthcare GmbH, Henkestraße 127, 91052 Erlangen, Germany. The static magnetic field B0 is generated by an arrangement of toroidal coils, with a pulsed incident RF signal used to generate the nuclear magnetic spin transition in tissue within the scanner. Eight channels are used to transmit the RF signal, with the ability to vary signal amplitude and phase, as well as execute channel-specific sensitivity profiling. These pulsed RF signals therefore localise the atomic excitation in space and create the observed contrast in the images obtained.

FIG. 1 is a flow chart of the steps in a computer-implemented method in accordance with at least some example embodiments. The magnetic resonance image optimisation method 100 comprises a number of steps that may be carried out using a data processing system that may be part of a scanner itself, or that may be hosted separately, for example, accessible via a network on a remote server or via cloud computing. Example embodiments provide a data processing system that is adapted to optimise a magnetic resonance image in accordance with the steps of the method outlined below. The location of the processor, and any data storage that may need to be accessed to retrieve and store data either for use in the methods according to example embodiments or generated by these methods may be located with the processor or remotely. Example embodiments also provide a computer program comprising instructions, which when the program is executed by a computer, such as the data processing system above, cause the computer to carry out the steps of the method outline below.

Initially, at step 102, the mapping of an image of an object is carried out. The image is obtained using a static magnetic field B0 and an incident radio frequency (RF) signal and mapped by dividing the image into m identically sized three-dimensional voxels. The dimensions of the voxels are determined by a desired mapping resolution but are preferably isotropic and in the range of 2 mm to 20 mm. Although it is preferable that the voxels are isotropic, it may be desirable in some situations to have non-isotropic voxels. Next at step 104, each voxel is represented in a Euclidean n-dimensional space, where n≥3. Each voxel has a voxel location represented by at least a two-dimensional position and at least one voxel characteristic represented by at least one further dimension. A voxel may therefore be represented by a two-dimensional position having x and y co-ordinates, or a three-dimensional position having x, y and z co-ordinates. At step 106, the voxel space is clustered by grouping together voxels having similar characteristics in order to create homogenous clusters. The characteristic preferably comprises a local B1+ transmit magnetic field amplitude induced by the incident RF signal at the voxel location, although, for example, the optimisation could be carried out for a static B0 magnetic field, in which case characteristic comprises a local B0 static magnetic field amplitude at the voxel location. For images where the characteristic comprises the local B1+ transmit magnetic field amplitude induced by the incident RF signal at the voxel location, the step of clustering preferably comprises partitioning the m voxels into j super voxels based on the nearest mean B1+ transmit magnetic field amplitude of a super-voxel. For images where the characteristic comprises the local B0 static magnetic field amplitude at the voxel location, preferably step of clustering comprises partitioning the m voxels into j super voxels based on the nearest B0 magnetic field amplitude of a super voxel.

At step 108, the centre or centroid of each cluster is determined. It may be desirable to determine both the centre and the centroid of each cluster, and compare optimised images obtained using both parameters. Alternatively, it may be desirable to discard the clustered voxels and consider only the determined centre or centroid. At step 110, the determined centre or centroid of each cluster, or the voxel closest to the determined centre or centroid is used as a super-voxel in an optimisation procedure. Finally, at step 112, an optimised diagnostic image of the object is generated.

Preferably, the clustering process itself is carried out using a k-means algorithm. K-means clustering is a method of vector quantisation that aims to partition n observations into k clusters. Each observation belongs to the cluster with the nearest mean—the cluster centre or centroid—which serves as a prototype of the cluster. Variances within each cluster are minimised as the algorithm assigns voxels to the cluster with the least squared Euclidean distance. However, other algorithms that perform clustering operations may also be used, such as those based on the k-means algorithm (k-means++, k-medians, k-medoids or fuzzy c-means). By construction, the k-means algorithm refines the clusters by comparing the Euclidean distance between each super-voxel and the different centres or centroids of existing clusters; these centres or centroids are obtained by taking the mean of the super-voxels belonging to each cluster and do not necessarily correspond to a super-voxel from the input set. Optionally, the super-voxels closest to the cluster centres or centroids can be selected as output instead. The resulting clustered map of the B1+ transmit magnetic field amplitude is therefore a subset of the input B1+ transmit magnetic field amplitude map. Using a combination of cluster centres, centroids or nearest voxel approaches may be beneficial in some circumstances.

The mapping process may comprise obtaining the image using one of: a circularly polarised B1+ field; an RF shimming technique; a homogenisation technique or a Direct Signal Control technique. Suitable homogenisation techniques include kT-points, spokes and SPINS. In the example below, RF shimming was used for the mapping process. Depending on the sizes of the clusters generated (in terms of the number of voxels within a cluster), selected voxels may be used to represent other voxels, for example, in a region with relatively homogenous B1+ transmit magnetic field amplitude. To avoid assigning too great an importance to smaller clusters over larger clusters at step 114 the method 100 may further comprise using at least one weighting parameter derived from the clustering process. Tracking the cardinality of the clusters creates weighting parameters that comprise the size of the cluster the super-voxel is derived from. These weighting parameters can then be incorporated in the optimisation procedure to obtain the final diagnostic image.

Figure 2B:
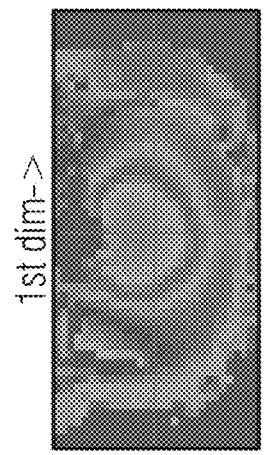
Figure 2C:
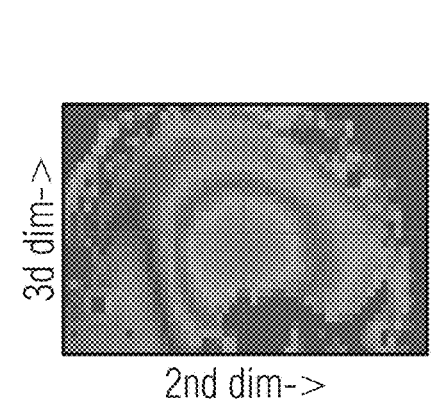
Figure 3A:
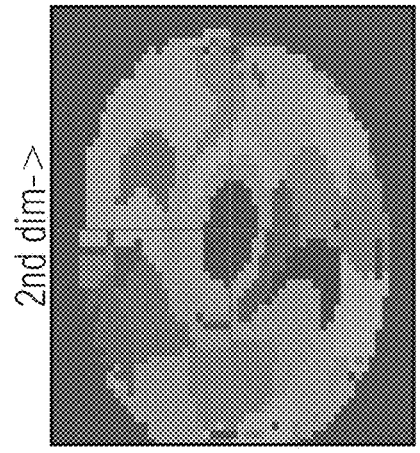
FIGS. 3A, 3B and 3C illustrate the spatially contiguous regions of B1+ formed from the clustering process of the voxels in FIGS. 2A-2C.
Figure 3B:
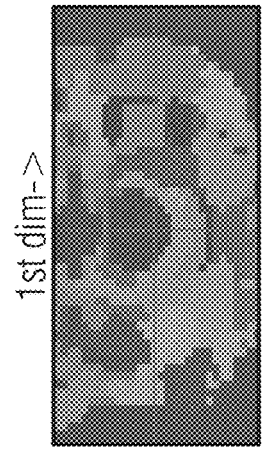
Figure 3C:
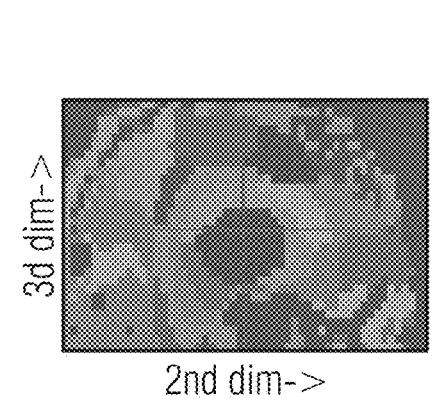

Example embodiments described above will now be illustrated by at least one example. Voxel selection was carried out for Direct Signal Control (DSC) as optimisation procedure, which in this case aimed at driving the magnetic resonance signal as close as possible to its nominal evolution along a fast spin echo (FSE) train. This was done by adjusting the complex weights of a parallel transmission system (with eight parallel transmission channels) independently from RF signal pulse to pulse. Reducing the number of voxels involved in the optimisation reduces the computing cost involved as DSC is computationally intensive with simulations of the signal evolution along potentially a very long echo train at every step of the optimisation. In addition, DSC does not rely on B0 gradients (unlike SPINS, spokes or kT-points, for example), hence selected voxels may be as distant from one another as required without risking Gibbs ringing effects, which are typical of gradient-based optimisation methods. FIGS. 2A-2C are a combined B1+ map used as a starting point for the DSC algorithm. The combined B1+ map is a linear combination of the eight transmission channels, with FIG. 2A being the map along a first dimension, FIG. 2B being the map along a second dimension, and FIG. 2C being the map along a third dimension. In this example, the voxels are represented in Euclidean space in four dimensions, with three dimensions representing the physical co-ordinates of the voxels and the fourth dimension being the magnitude of the combined B1+ map. The initial number of voxels was over 40,000. Once the resulting vectors from the representation of the voxels in Euclidean space were centred and normalised, k-means clustering was carried out. This resulted in spatially contiguous regions of similar B1+ magnitudes, where the number of desired super-voxels, Nv, and therefore the number of clusters, was 100, reduced from the original 40,000 voxels. FIGS. 3A-3C illustrate the spatially contiguous regions of B1+ formed from the clustering process of the voxels in FIGS. 2A-2C, respectively. In other words, the B1+ map of FIGS. 2A-2C is used as the fourth dimension since this indicates the amplitude of the B1+ magnetic field. Again, FIG. 3A is the result of the clustering process along a first dimension, FIG. 3B is the result of the clustering process along a second dimension, and FIG. 3C is the result of the clustering process along a third dimension.

Figure 4A:
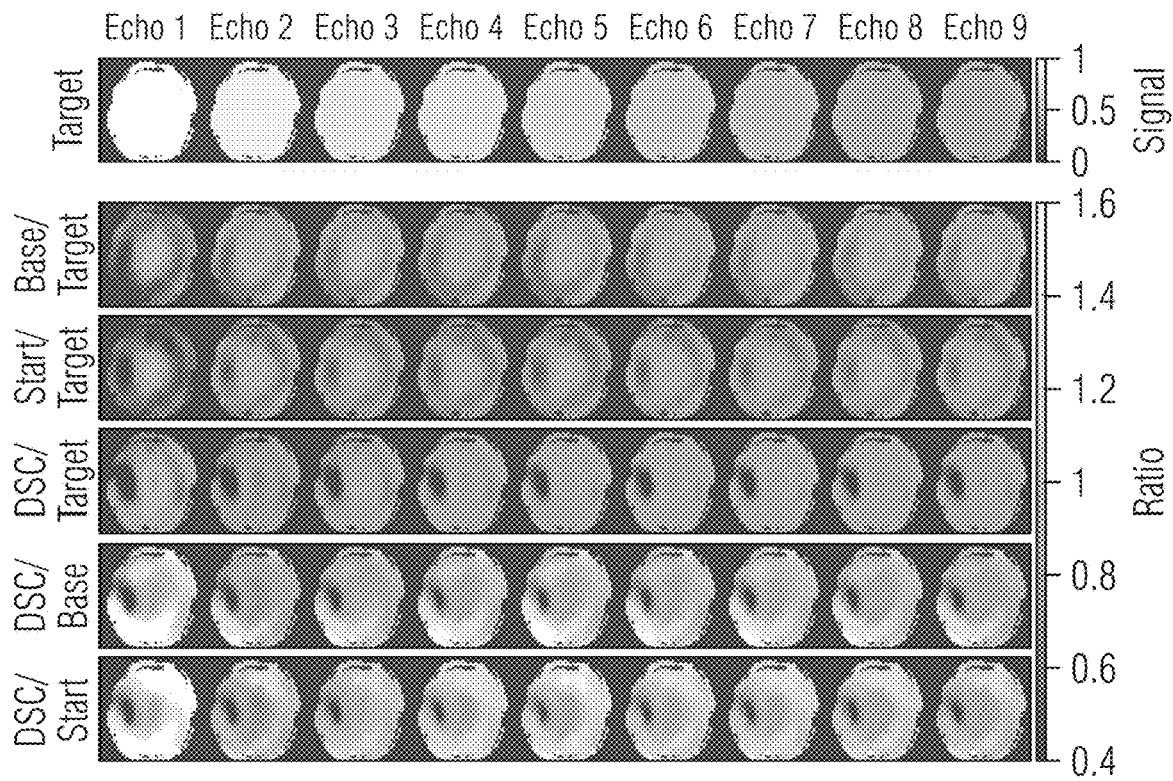
FIGS. 4A-4B illustrate a comparison between the signal optimized at each echo of a Fast Spin Echo (FSE) train using a) 300 randomly selected voxels and b) 100 super-voxels generated using at least some example embodiments.
Figure 4B:
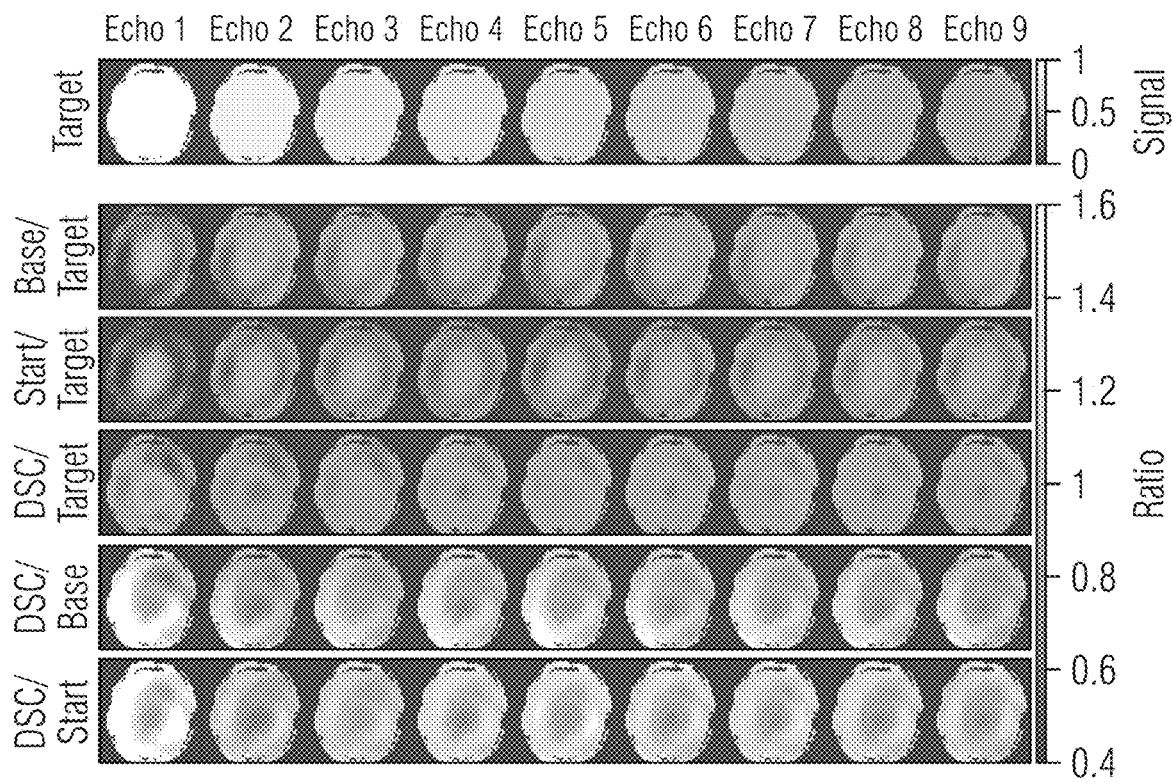

FIGS. 4A-4B are a comparison between the signal at each echo of a FSE train using a) 300 randomly selected voxels and b) 100 super-voxels generated using example embodiments. Each panel in FIGS. 4A-4B contains data for nine echoes (one for each echo of the FSE train), and six rows of image data:

Row 1: target (nominal) signal;
Row 2: ratio of signal obtained using circular polarisation to target;
Row 3: ratio of signal obtained using RF shimming to target;
Row 4: ratio of signal obtained using DSC to target;
Row 5: ratio of signal obtained using DSC to circular polarisation; and
Row 6: ratio of signal obtained using DSC to RF shimming.

The panel of FIG. 4A was derived from running DSC optimisation on 300 randomly selected voxels throughout the whole brain. Each image shows a scan of one slice in an adult human brain. The panel of FIG. 4B was derived from running DSC optimisation on 100 super-voxels generated using example embodiments in the whole brain. It can be seen that in the panel of FIG. 4A there is a deep and localised signal void SV located at the left hand side of the image when random voxels are used. Such a void SV is absent in the panel of FIG. 4B where images have been optimised using the clustering method in accordance with example embodiments. Images optimised in accordance with example embodiments show greater homogeneity when compared with those optimised using randomly selected voxels.

One advantage that example embodiments offer is the ability to deal with small (5 mm3 isotropic) voxel sizes. However, in optimisation methods that do not rely on spatial encoding (use of static magnetic field gradients) it may be useful to limit the number of input voxels beyond this 5 mm3 isotropic resolution. This may aid performance, for example, provide a reduction in computing cost. The issue here is that selecting 100 voxels in a 1.2 L brain results in an average voxel volume of 12 cm3. The centre-to-centre distance between such voxels is approximately 23 mm, increasing the likelihood that the voxel grid is misaligned with B1+ field inhomogeneity patterns. Consequently, regions of high or low B1+ transmit magnetic field amplitude may be missed. Since the clustering approach of example embodiments is data-driven, it is based directly on features of interest for image optimisation. The method outlined above provides an effective voxel size that can adapt to the regions of volumes of interest. For example, a coarser voxel density in regions of relatively homogeneous B1+ field amplitude, and a finer voxel density in regions of relatively inhomogeneous B1+ field amplitude. The optional weighting of selected voxels by the cardinality or size of their respective clusters can ensure that homogeneous regions are not omitted from the optimisation, reducing any possible induced inhomogeneity in the optimised image.

Figure 5:
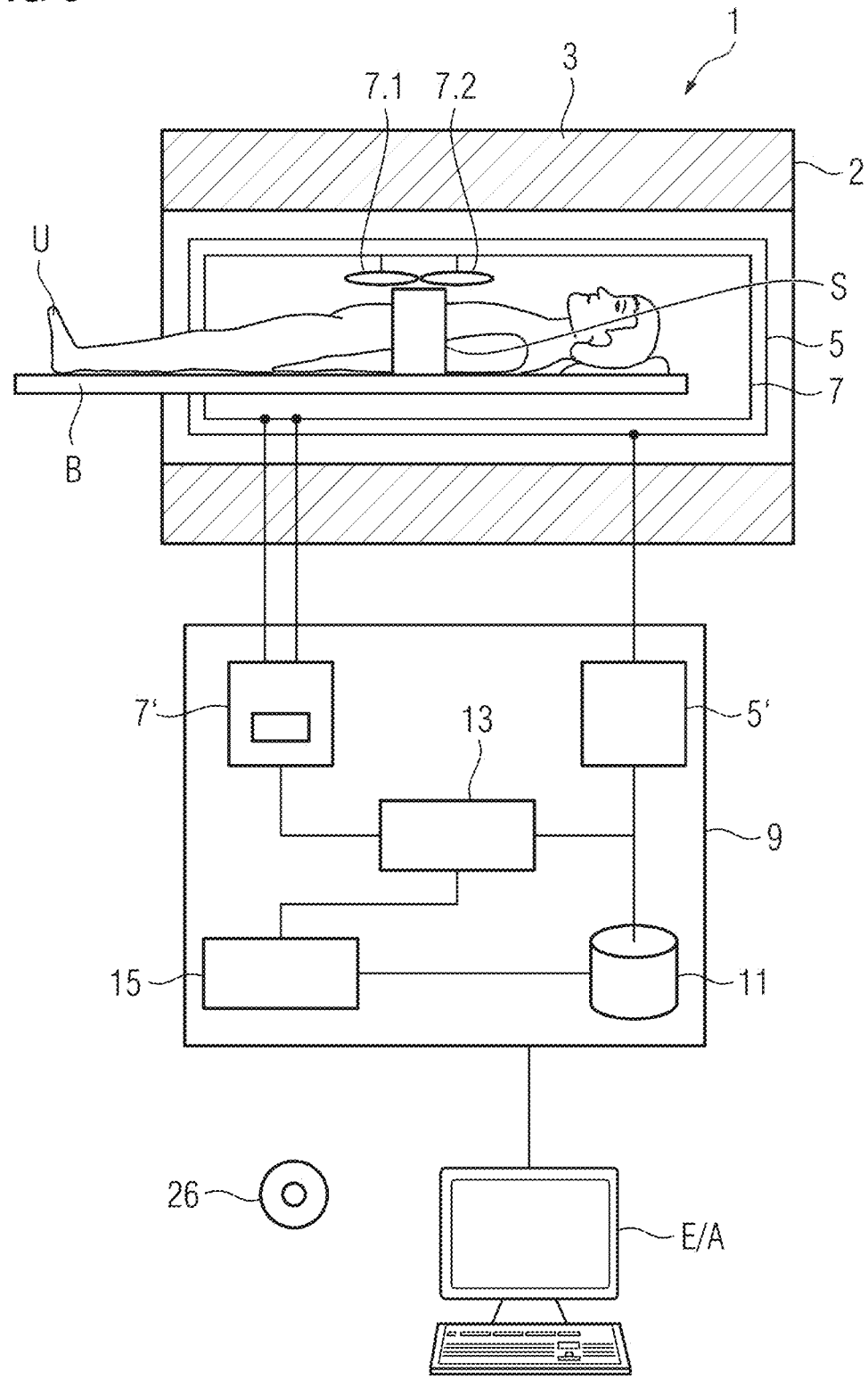
FIG. 5 illustrates a schematic representation of an MRI apparatus according to at least one example embodiment.

FIG. 5 schematically shows a magnetic resonance (MR) apparatus 1. The MR apparatus 1 has an MR data acquisition scanner 2 with a basic field magnet 3 that generates a static magnetic field B0, a gradient coil arrangement 5 that generates the gradient fields, one or several radio-frequency (RF) antennas 7 for radiating and receiving radio-frequency signals, and a control computer 9 configured to perform any or all embodiments of the method according to embodiments of the present invention. In FIG. 5 such sub-units of the magnetic resonance apparatus 1 are only outlined schematically. The radio-frequency antennas 7 may include a coil array comprising at least two coils, for example the schematically shown coils 7.1 and 7.2, which may be configured either to transmit and receive radio-frequency signals or only to receive the radio frequency signals (MR signals).

In order to acquire MR data from an examination object U, for example a patient or a phantom, the examination object U is introduced on a bed B into the measurement volume of the scanner 2. The slab S is an example of a 3D slab of the examination object, from which MR data can be acquired using a method according to an embodiment of the present invention. The control computer 9 centrally controls the magnetic resonance apparatus 1, and can control the gradient coil arrangement 5 with a gradient controller 5' and the radio-frequency antenna 7 with a radio-frequency transmit/receive controller 7'. The radio-frequency antenna 7 has multiple channels corresponding to the multiple coils 7.1, 7.2 of the coil arrays, in which signals can be transmitted or received. The radio-frequency antenna 7 together with its radio-frequency transmit/receive controller 7' is responsible for generating and radiating (transmitting) a radio-frequency alternating field for manipulating the nuclear spins in a region to be examined (in particular in the slab S) of the examination object U. The control computer 9 also has an imaging protocol processor 15 that determines the reordering pattern.

A control unit/processor 13 of the control computer 9 is configured to execute all the controls and computation operations required for acquisitions and data processing. Intermediate results and final results required for this purpose or determined in the process can be stored in a memory 11 of the control computer 9. The memory 11 may also store computer-readable instructions to be executed by the control unit/processor 13 to perform any or all example embodiments.

The units shown here should not necessarily be considered as physically separate units, but simply represent a subdivision into functional units, which can also be implemented by fewer physical units, or just one. A user can enter control commands into the magnetic resonance apparatus 1 and/or view displayed results, for example image data, from the control computer 9 via an input/output interface E/A.

A non-transitory data storage medium 26 can be loaded into the control computer 9, and may be encoded with computer-readable instructions (program code) that, when executed by the control unit/processor 13, cause the control computer 9, and the various functional units thereof described above, to implement any or all embodiments of the method according to embodiments of the present invention.

In at least one example embodiment, the control unit/processor 13 is configured to cause the control computer 9 to, map an image of an object obtained using a static magnetic field and an incident radio frequency (RF) signal by dividing the image into identically sized three-dimensional voxels, the dimensions of the voxels being determined by a desired mapping resolution; represent each voxel in a Euclidean n-dimensional space, where n≥3, each voxel having a voxel location represented by at least a two-dimensional position and at least one voxel characteristic represented by at least one further dimension; cluster the voxel space by grouping together voxels having similar voxel characteristics to create homogenous clusters; determine a centre or centroid of each cluster; use either the determined centre or centroid of each cluster, or the voxel closest to the determined centre or centroid as a super-voxel in an optimisation procedure; and generate an optimised diagnostic image of the object.

In some example embodiments, the control computer 9 may be referred to as a data processing system. In some example embodiments, a data processing system comprising a processor configured to cause the data processing system to perform any or all embodiments of the method according to embodiments of the present invention may be remote from the scanner.

The invention claimed is:

1. A computer-implemented magnetic resonance image optimisation method, comprising:
    mapping an image of an object obtained using a static magnetic field and an incident radio frequency signal by dividing the image into identically sized three-dimensional voxels, dimensions of the identically sized three-dimensional voxels being determined by a desired mapping resolution;
    representing each voxel in a Euclidean n-dimensional space, where n≥3, each voxel having a voxel location represented by at least a two-dimensional position and at least one voxel characteristic represented by at least one further dimension;
    clustering the Euclidean n-dimensional space by grouping together voxels having similar voxel characteristics to create homogenous clusters;
    determining a centre or centroid of each cluster;
    using either the determined centre or centroid of each cluster, or the voxel closest to the determined centre or centroid, as a super-voxel in an optimisation procedure; and
    generating an optimised diagnostic image of the object, wherein each voxel characteristic includes at least one of a local transmit magnetic field amplitude induced by the incident RF signal at the voxel location or a local static magnetic field amplitude at a respective voxel location.

2. The method as claimed in claim 1, wherein each voxel location is represented by a two-dimensional position having x and y coordinates.

3. The method as claimed in claim 1, wherein each voxel location is represented by a three-dimensional position having x, y and z coordinates.

4. The method as claimed in claim 1, wherein in response to each voxel characteristic including the local transmit magnetic field amplitude induced by the incident RF signal at the voxel location, the step of clustering comprises partitioning the identically sized three-dimensional voxels into super voxels based on a nearest mean transmit magnetic field amplitude of one of the super voxels.

5. The method as claimed in claim 1, wherein in response to each voxel characteristic including the local static magnetic field amplitude at the respective voxel location, the step of clustering comprises partitioning the identically sized three-dimensional voxels into super voxels based on a nearest magnetic field amplitude of one of the super voxels.

6. The method as claimed in claim 1, wherein the clustering is performed using a k-means algorithm.

7. The method as claimed in claim 1, wherein the mapping includes,
obtaining the image using one of a circularly polarised field, an RF shimming technique, a homogenisation technique or a Direct Signal Control technique.

8. The method as claimed in claim 1, wherein the optimisation procedure further comprises:
using at least one weighting parameter derived from tracking a cardinality of the clusters.

9. The method as claimed in claim 8, wherein the at least one weighting parameter comprises a size of the cluster the super-voxel is derived from.

10. A data processing system adapted to optimise a magnetic resonance image, comprising:
at least one processor configured to cause the data processing system to,
map an image of an object obtained using a static magnetic field and an incident radio frequency (RF) signal by dividing the image into identically sized three-dimensional voxels, dimensions of the identically sized three-dimensional voxels being determined by a desired mapping resolution;
represent each voxel in a Euclidean n-dimensional space, where n≥3, each voxel having a voxel location represented by at least a two-dimensional position and at least one voxel characteristic represented by at least one further dimension;
cluster the Euclidean n-dimensional space by grouping together voxels having similar voxel characteristics to create homogenous clusters;
determine a centre or centroid of each cluster;
use either the determined centre or centroid of each cluster, or the voxel closest to the determined centre or centroid as a super-voxel in an optimisation procedure; and
generate an optimised diagnostic image of the object,
wherein each voxel characteristic includes at least one of a local transmit magnetic field amplitude induced by the incident RF signal at the voxel location or a local static magnetic field amplitude at a respective voxel location.

11. A non-transitory computer readable medium comprising instructions that, when executed by a computer, cause the computer to perform the method of claim 1.

* * * * *